(12) United States Patent
Paul et al.

(10) Patent No.: US 6,969,680 B2
(45) Date of Patent: Nov. 29, 2005

(54) METHOD FOR MAKING SHIELDED CAPACITOR STRUCTURE

(75) Inventors: Susanne A. Paul, Austin, TX (US);
Timothy J. Dupuis, Austin, TX (US);
Ali M. Niknejad, Berkeley, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 10/814,616

(22) Filed: Mar. 31, 2004

(65) Prior Publication Data
US 2005/0030699 A1    Feb. 10, 2005

Related U.S. Application Data

(63) Continuation of application No. 10/094,859, filed on Mar. 11, 2002, now Pat. No. 6,737,698.

(51) Int. Cl.[7] .......................................... H01L 21/336
(52) U.S. Cl. .................... 438/669; 438/253; 257/306
(58) Field of Search .................................. 257/306, 307, 257/308, 309, 300; 438/669; 361/313

(56) References Cited

U.S. PATENT DOCUMENTS

| 4,470,096 | A  | * | 9/1984 | Guertin ...................... 361/277 |
| 6,737,698 | B1 | * | 5/2004 | Paul et al. .................. 257/306 |

* cited by examiner

Primary Examiner—David Nelms
Assistant Examiner—Thinh T Nguyen
(74) Attorney, Agent, or Firm—Johnson & Associate

(57) ABSTRACT

A method and apparatus if provided for shielding a capacitor structure formed in a semiconductor device. In a capacitor formed in an integrated circuit, one or more shields are disposed around layers of conductive strips to shield the capacitor. The shields confine the electric fields between the limits of the shields.

20 Claims, 7 Drawing Sheets

METHOD FOR MAKING SHIELDED CAPACITOR STRUCTURE

CROSS REFERENCE TO RELATED APPLICATIONS

This application is a continuation of commonly owned U.S. patent application Ser. No. 10/094,859, filed on Mar. 11, 2002 now U.S. Pat. No. 6,737,698, entitled "SHIELDED CAPACITOR STRUCTURE."

FIELD OF THE INVENTION

This invention relates to the field of capacitors. In particular, this invention relates to shielded capacitor structures in integrated circuits.

BACKGROUND OF THE INVENTION

There are numerous applications for capacitors formed on integrated circuits. In many of these applications, such as with high frequency integrated circuits, metal-to-metal capacitors are often used because they have a number of advantages over other types of capacitors, such as those formed from gate oxide. For example, metal-to-metal capacitors provide a higher quality factor than gate-oxide capacitors, and the quality factor is independent of the dc voltage of the capacitor. Also, metal-to-metal capacitors provide better linearity than gate-oxide capacitors.

Typical prior art metal-to-metal capacitors use parallel plate structures where the vertical distance between the parallel plates is much less than the lateral dimensions of the plates. In this case, fringing electric fields are present at the edges of the capacitor plates, but most of the electric fields are confined to the region between the capacitor plates.

Another type of prior art capacitor takes advantage of the reduced size of intralayer metal spacings. In this type of capacitor, vertically spaced fingers are connected to alternate capacitor nodes to provide a higher capacitance density than parallel plate structures. FIG. 1 is a perspective side view of a prior art vertical finger capacitor 100. Note that FIG. 1 shows the spatial relationship between the capacitor fingers and does not show the remainder of the capacitor or the integrated circuit.

FIG. 1 shows a capacitor 100 formed between nodes A and B (not shown). The capacitor 100 includes a first set of fingers connected to node A and a second set of fingers connected to node B. The capacitor fingers shown in FIG. 1 are formed in four levels of metal in an integrated circuit. As shown, the fingers alternate between nodes A and B such that each A finger on the second and third levels of metal is surrounded by four neighboring B fingers and each B finger on the second and third levels of metal is surrounded by four neighboring A fingers. This structure provides greatest capacitance density when each finger is made from a minimum-width line of metal and a minimum spacing separates adjacent fingers.

FIG. 2 is a diagram illustrating the electric fields for the capacitor structure shown in FIG. 1. As shown, significant electric fields are present around the capacitor fingers. There are several disadvantages with prior art capacitors such as the capacitor shown in FIGS. 1 and 2. First, the electric fields present around the capacitor can interact with materials present around the fingers and cause loss in these materials, which reduces the quality factor of the capacitor. Second, the capacitance of the capacitor shown in FIGS. 1 and 2 is difficult to predict because it is impacted by the properties of materials around the fingers, which may be different than the properties of the dielectric present between the fingers.

SUMMARY OF THE INVENTION

An apparatus of the invention is provided for a capacitor structure formed on a semiconductor substrate for providing capacitance between a first node and a second node comprising: one or more layers of conductive strips, said conductive strips in each layer alternately connected to the first and second nodes, and a conductive plate disposed above or beneath the lowest of the one or more layers of conductive strips.

One embodiment of the present invention provides a capacitor structure formed on a semiconductor substrate for providing capacitance between a first node and a second node comprising: one or more layers of conductive strips, each of said conductive strips in each layer being connected to one of the first or second nodes, and a conductive shield disposed adjacent to the capacitor structure for shielding the capacitor structure.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The present invention solves the problems discussed above by providing shielding to a capacitor structure formed in a semiconductor device. In general, the present invention provides a capacitor formed in an integrated circuit with one or more layers of conductive strips (i.e., capacitor fingers) connected to one of two nodes of the capacitor. One or more shields are disposed adjacent to the layers of conductive strips and are also connected to one of the nodes. The shields confine the electric fields between the nodes between the limits of the shields. As described below, the present invention may include numerous variations within the spirit and scope of the invention.

Figure 1:
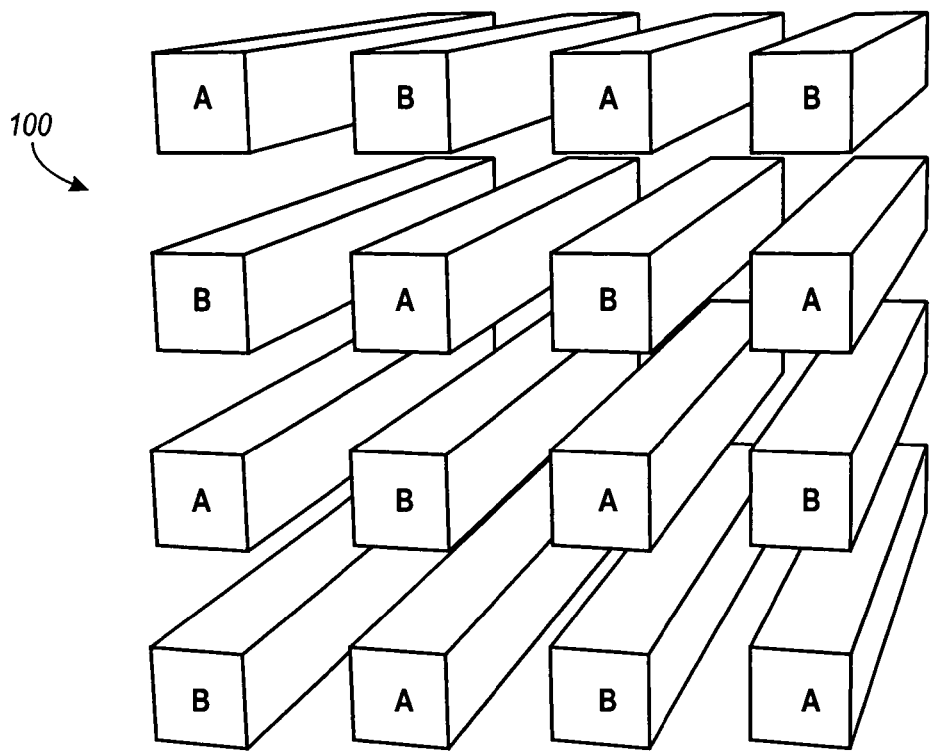
FIG. 1 is a perspective side view of a prior art vertical finger capacitor.
Figure 2:
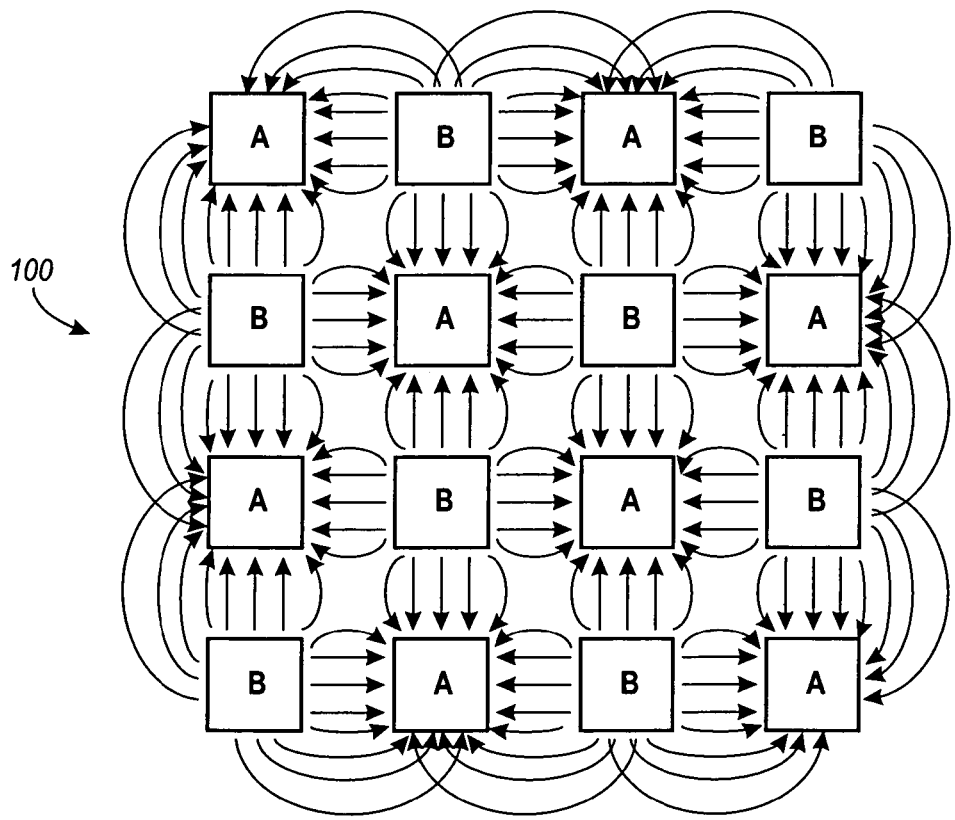
FIG. 2 is a diagram illustrating the electric fields for the capacitor structure shown in FIG. 1.
Figure 3:
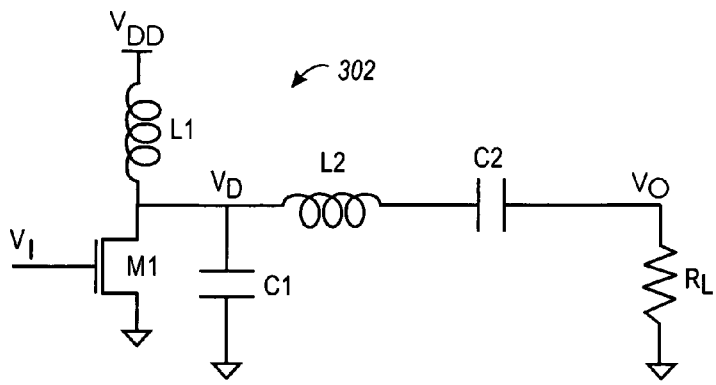
FIG. 3 is a schematic diagram of a power amplifier formed on an integrated circuit that may utilize the capacitor structures of the present invention.

In order to provide a context for understanding this description, the following illustrates one example of a typical application of the present invention. The present invention may be used in any desired application, such as with high frequency integrated circuits. In one example, the present invention may be used with a power amplifier formed on an integrated circuit. FIG. 3 is a schematic diagram of a power amplifier 302 formed on an integrated circuit for use with a wireless transmission system such as a wireless telephone or other device. The power amplifier 302 includes capacitors C1 and C2, which may be implemented using the shielded capacitor structure of the present invention. In the case of a wireless telephone application, the invention may be applied to GSM, CDMA, PCS, DCS, etc., or other wireless systems. Of course, the present invention may be used in any application where a shielded capacitor structure is desirable.

Figure 4:
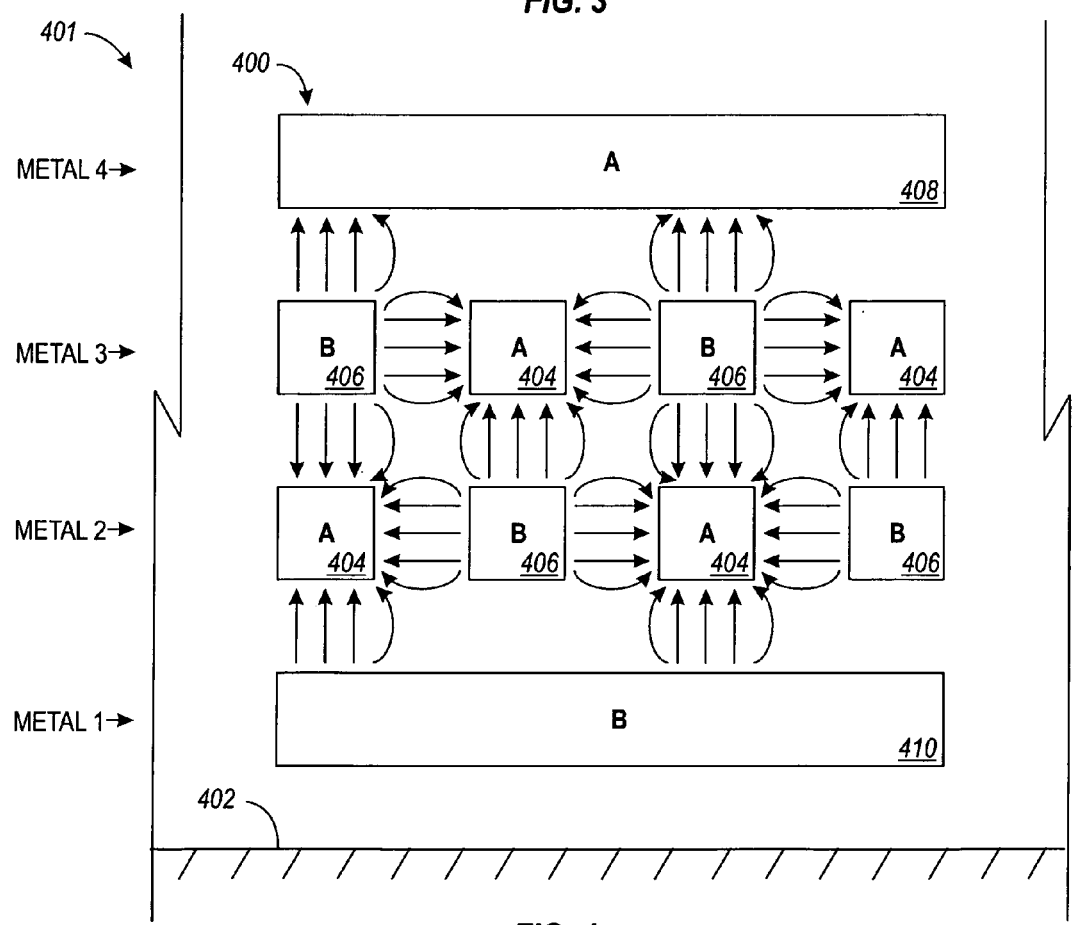
FIG. 4 is sectional view of an example of a capacitor structure of the present invention.

FIG. 4 is sectional view of an example of a capacitor structure of the present invention. FIG. 4 shows a capacitor 400 formed on a silicon substrate 402 as part of an integrated circuit 401 (other components of the integrated circuit 401 are not shown). Note that the structure of the integrated circuit 401 extends beyond what is shown in FIG. 4. For example, the structure of the integrated circuit 401 may extend past the capacitor 400, as shown in FIG. 4. The integrated circuit 401 may also include components placed above or below the capacitor 400. Similarly, this also applies to the embodiments shown in FIGS. 5–13 (described below), even though FIGS. 5–13 only show the capacitors.

The capacitor 400 is built using four layers of metal, designated as METAL 1, METAL 2, METAL 3, and METAL 4. Formed in the METAL 2 layer is a first row of conductive strips. A first set of conductive strips 404 is connected to node A of the capacitor. Similarly, a second set of conductive strips 406 is connected to node B of the capacitor. In the example shown in FIG. 4, the conductive strips 404 and 406 alternate, although other configurations may also be used. A second row of conductive strips is formed in the METAL 3 layer. The second row of conductive strips also has first and second sets of conductive strips 404 and 406 connected to nodes A and B of the capacitor. In the example shown in FIG. 4, the conductive strips 404 in the METAL 3 layer are positioned above conductive strips 406 in the METAL 2 layer. FIG. 4 also shows a first shield 408 formed in the METAL 4 layer above the conductive strips. The shield 408 is formed by a solid conductive plate and is connected to node A of the capacitor. A second shield 410 is formed in the METAL 1 layer below the conductive strips. The shield 410 is formed by a solid conductive plate and is connected to node B of the capacitor. A dielectric material, or insulating layers, surrounds and separates the various metal layers.

FIG. 4 also illustrates the electric fields present in the capacitor 400. As shown, the shields 408 and 410 confine the electric fields from node A to node B (as illustrated by the arrows) within the limits of the shields 408 and 410. One advantage of the capacitor structure shown in FIG. 4 is that the capacitance value of the capacitor 400 can be more accurately predicted because it involves only the metal conductors and the dielectric insulator between them. Also, the electric field from nodes A to B does not pass through materials such as the Silicon substrate 402 below the first metal layer or components above the top metal layer. One disadvantage of the capacitor structure shown in FIG. 4, compared to a prior art non-shielded capacitor taking up the same area, is that it has less capacitance per unit area because there is little field between the "A" shield 408 and the "A" conductive strips 404 located below it. Similarly there is little field between the "B" shield 410 and the "B" conductive strips 406 located above it. The capacitor structure of FIG. 4 has shunt capacitance from the shield 410 to any conductors below the first metal layer and from the shield 408 to any conductors above the topmost metal layer. However, this shunt capacitance does not affect value of the capacitance between nodes A and B and may not need to be predicted as accurately. In most cases, shunt capacitance to the shield 408 is very small but that to the shield 410 from the underlying Silicon substrate 402 is fairly large. So, this structure is useful in cases where shunt capacitance from node B is less critical than shunt capacitance from node A.

A shielded capacitor structure of the present invention can take on many configurations in addition to the example shown in FIG. 4. FIGS. 5–13 show additional examples of shielded capacitors of the present invention. Note that, in addition to the examples given, other embodiments are also possible. In addition, various combinations of configurations are also possible.

Figure 5:
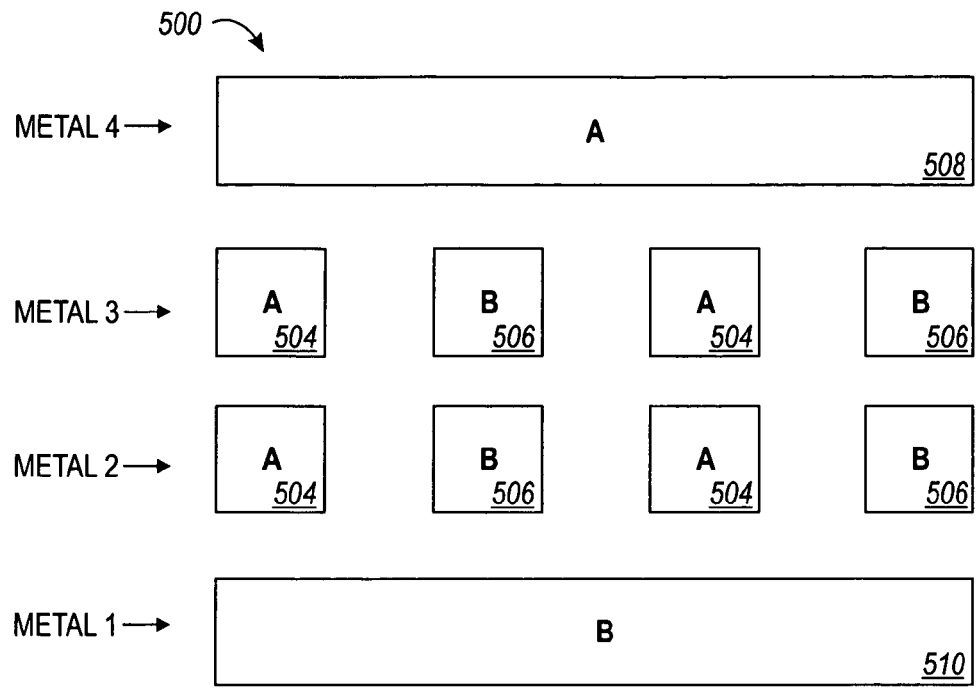
FIGS. 5–13 show additional examples of shielded capacitors of the present invention.

FIG. 5 shows a capacitor 500, which is similar to the capacitor 400 shown in FIG. 4, except that the conductive strips 504 and 506 are arranged differently. Like FIG. 4, FIG. 5 includes a first shield 508 formed in the METAL 4 layer and a second shield 510 formed in the METAL 1 layer. The conductive strips 504 connected to node A in the METAL 3 layer are positioned above the conductive strips 504 connected to node A in the METAL 2 layer. Similarly, the conductive strips 506 connected to node B in the METAL 3 layer are positioned above the conductive strips 506 connected to node B in the METAL 2 layer.

Figure 6:
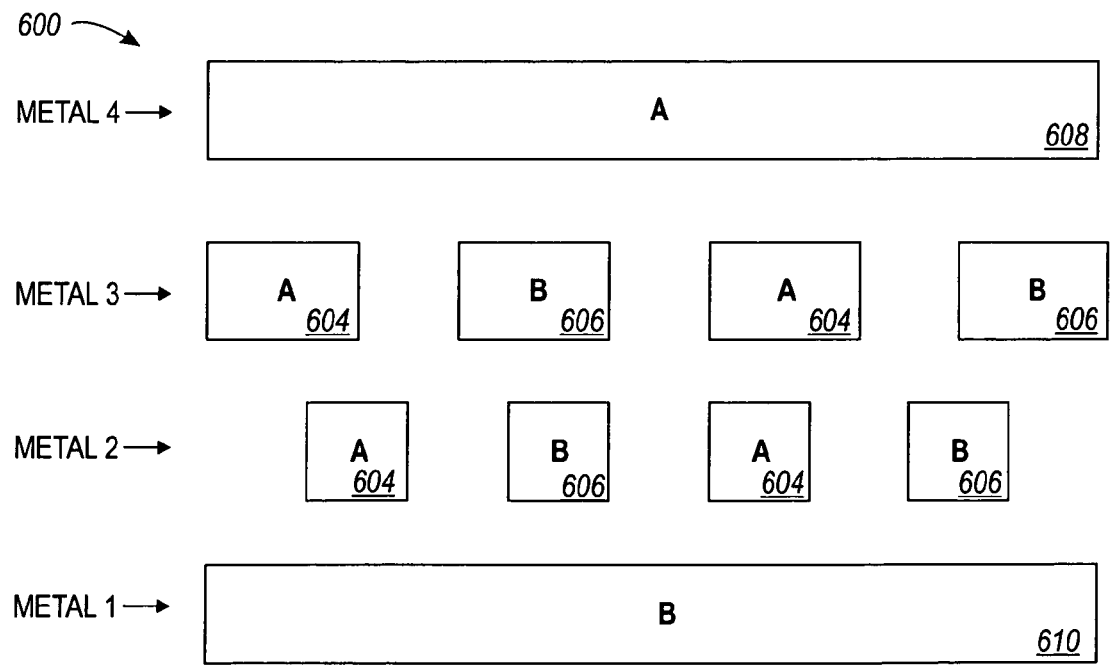

FIG. 6 shows an example of a capacitor 600 where the conductive strips 604 and 606 are not all the same size and not all aligned. The capacitor 600 may be used, for example, when the process-specified minimum widths of conductors in one metal layer (e.g., METAL 2) is different from that in another metal layer (e.g., METAL 3). Conductive strips in various layers can therefore have the same or different widths and spacing.

Figure 7:
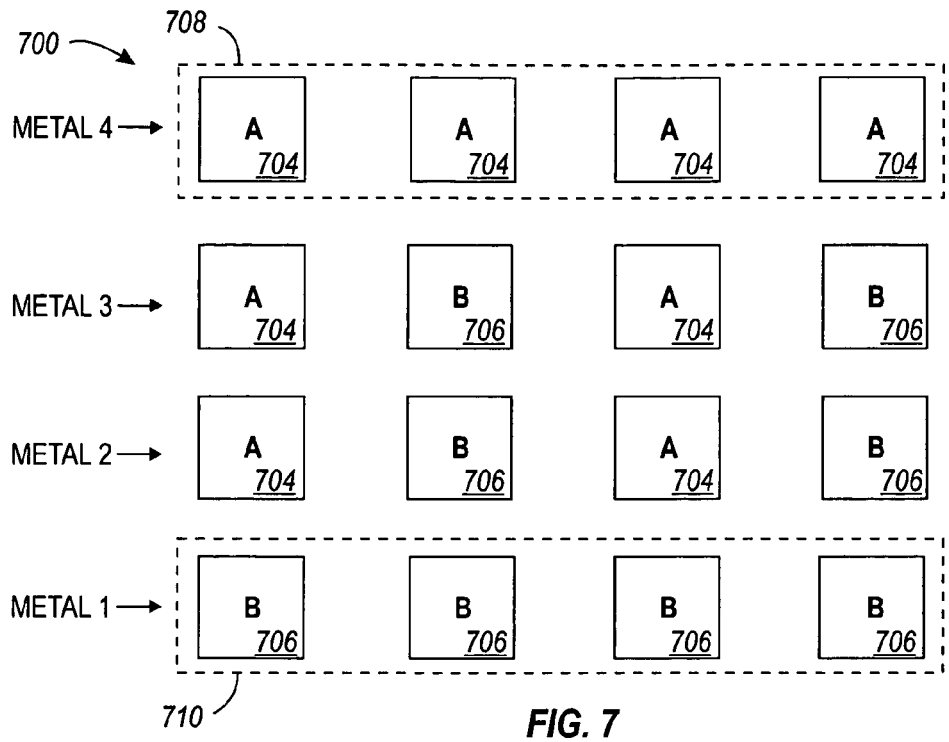

FIG. 7 shows an example of a capacitor 700 where the shields 708 and 710 are comprised of conductive strips 704 and 706 rather than a continuous metal plate. The shields 708 and 710 are illustrated by a dashed box around the conductive strips formed in the METAL 1 and METAL 4 layers.

Figure 8:
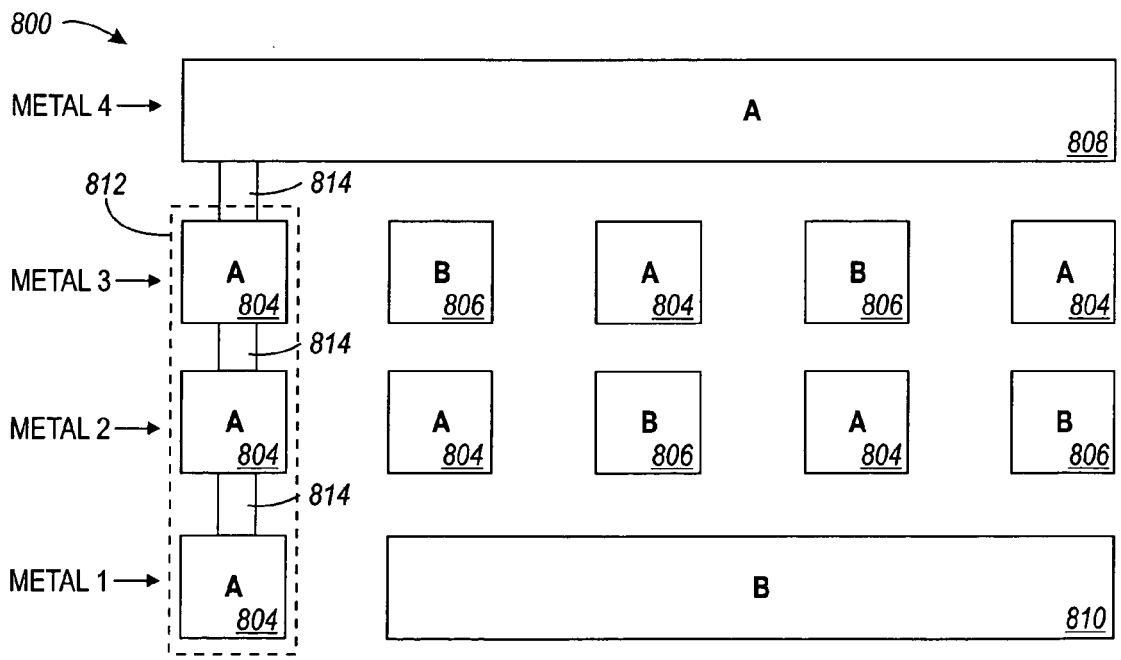

FIG. 8 shows an example of a capacitor 800 that, in addition to the top shield 808 and the bottom shield 810, has a side shield 812. The side shield 812 is formed by conductive strips 804 formed on the METAL 1, 2, and 3 layers and connected to node A. In this example, the conductive strips 804 of the side shield 812 are connected to each other, and to the top shield 808, by vias 814. Of course, the side shield 812 could also be made from conductive strips 806 connected to node B. If desired, a side shield could be formed on both sides of the capacitor 800, or used without top and/or bottom shields.

Figure 9:
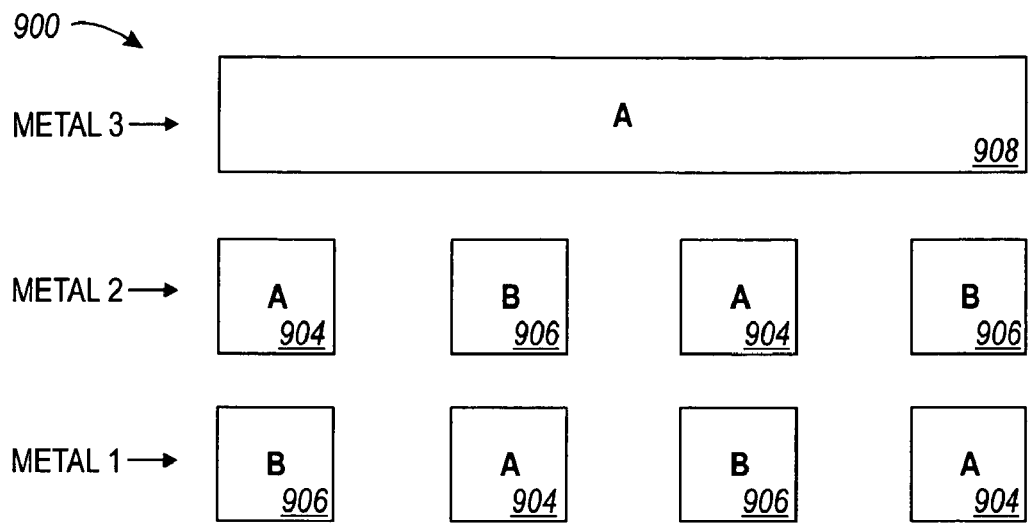
Figure 10:
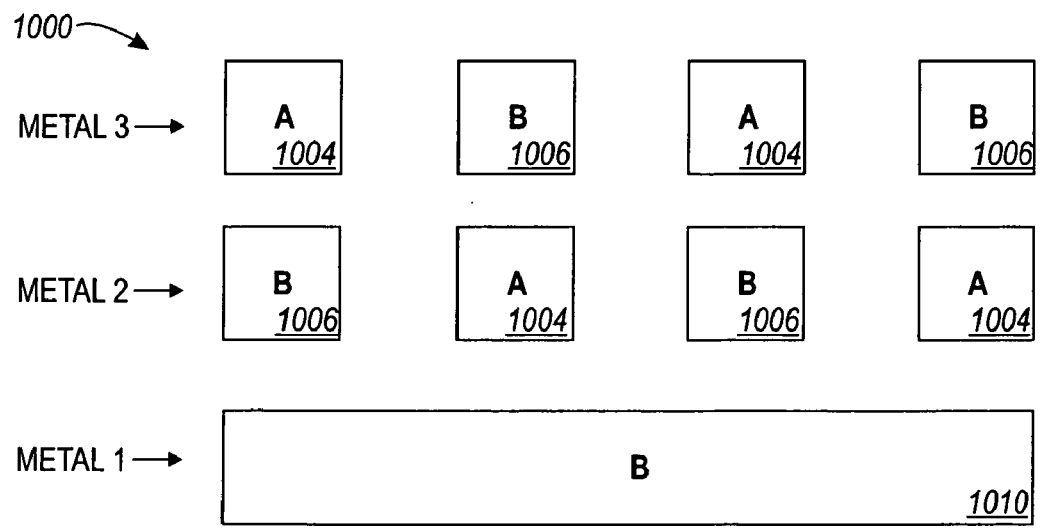

FIG. 9 shows an example of a capacitor 900 similar to the capacitor 400 shown in FIG. 4 with only a top shield 908. Similarly, FIG. 10 shows a capacitor 1000 with only a bottom shield 1010. In some applications, only one shield may be necessary. For example, when the properties and geometries of materials above the topmost capacitor metal layer are well known, but isolation from the substrate is desirable, then a structure can be used that includes only the lower shield plate 1010 (FIG. 10). However, if the properties and geometries of materials above the topmost capacitor metal layer make an upper shield desirable, and a lower shield is not desirable, then a structure can be used that includes only the upper shield plate 908 (FIG. 9).

Figure 11:
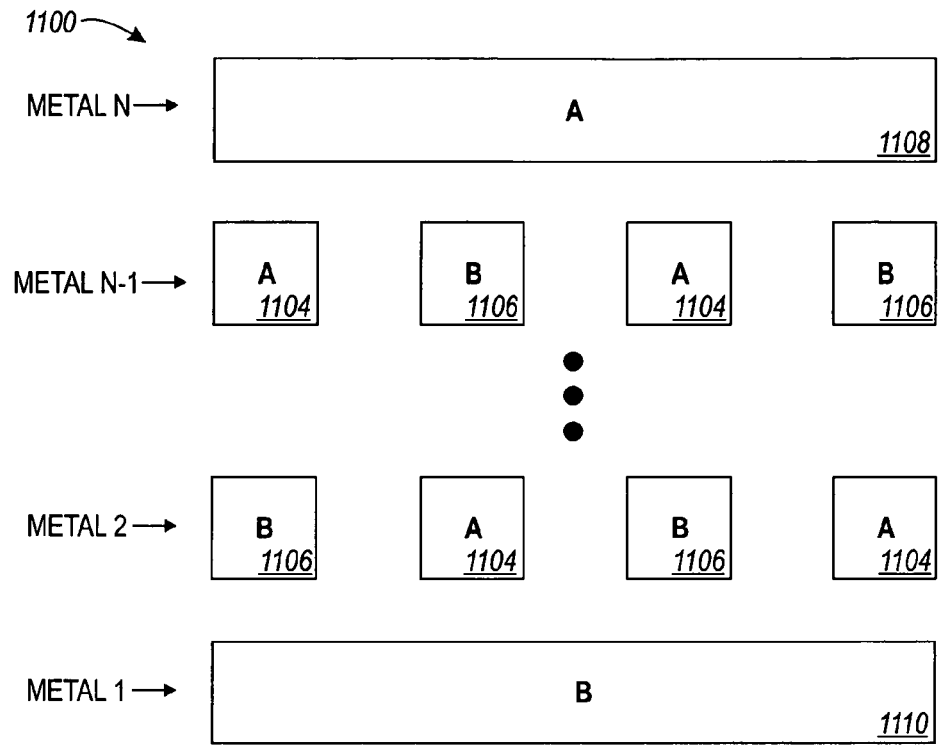

A capacitor structure of the present invention may be formed using any number of layers of conductive strips. FIG. 11 shows an example of a capacitor 1100 formed on N metal layers and having N-2 layers of conductive strips 1104 and 1106.

Figure 12:
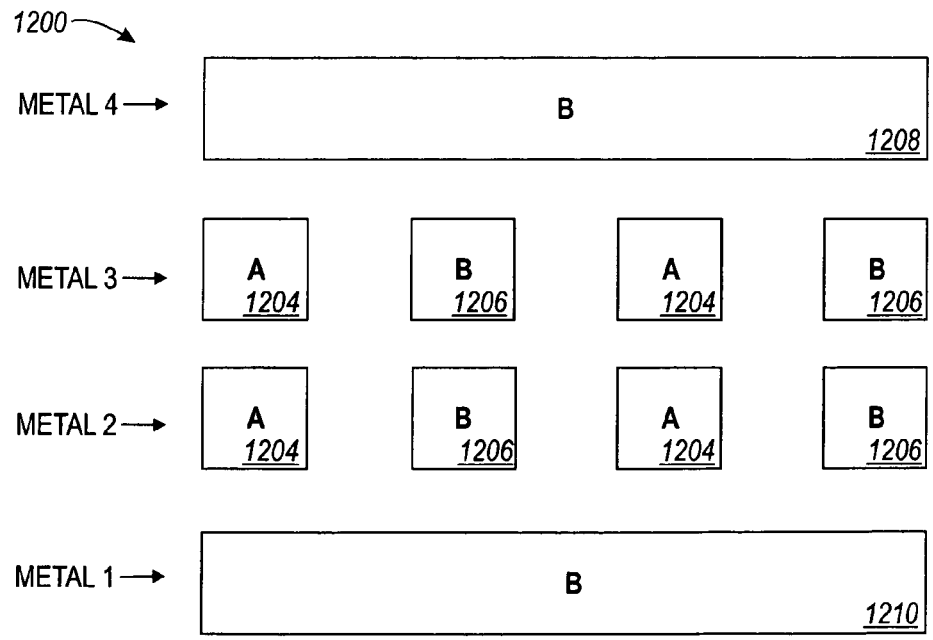
Figure 13:
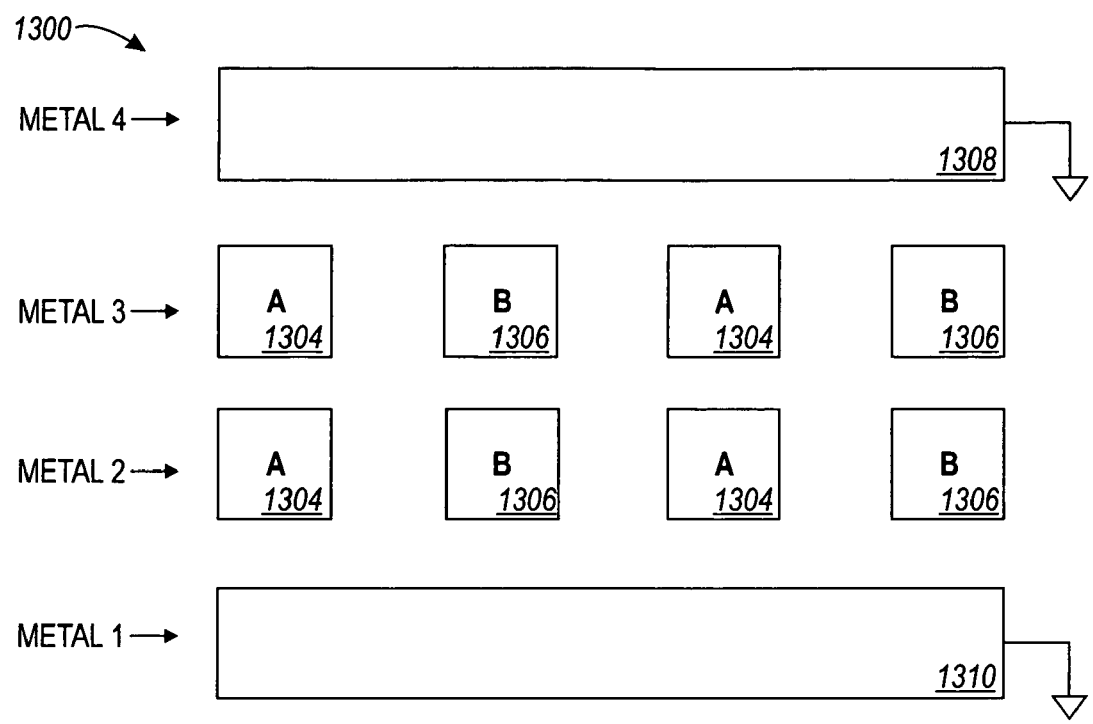

The shields of the present invention may take on numerous forms in addition to the examples described above. For example, FIG. 12 shows an example of a capacitor 1200 where the top shield 1208 and bottom shield 1210 are connected to the same node (node B in this example). FIG. 13 shows an example of a capacitor 1300 where the top and bottom shields 1308 and 1310 are connected to a third node, shown in this example as reference voltage (e.g., ground) rather than to nodes A or B.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A method for providing a capacitance between a first node and a second node on a semiconductor substrate, the method comprising:
    forming a plurality of layers of conductive strips on the substrate;
    configuring each of the layers to have a plurality of conductive strips, with the conductive strips in each layer being alternately connected to the first and second nodes,
    forming a conductive plate adjacent to the plurality of layers of conductive strips; and
    coupling the conductive plate to one of the nodes.

2. The method of claim 1, wherein the plurality of layers of conductive strips are aligned so that strips connected to the first node lie above strips connected to the second node.

3. The method of claim 1, wherein the conductive plate is disposed beneath the lowest of the plurality of layers of conductive strips.

4. The method of claim 3, the method further comprising forming a second conductive plate disposed above the highest of the plurality of layers of conductive strips.

5. The method of claim 4, wherein the conductive plate is coupled to the first node and the second conductive plate is coupled to the second node.

6. The method of claim 4, wherein the conductive plate is coupled to the first node and the second conductive plate is also coupled to the first node.

7. The method of claim 1, wherein the conductive plate is disposed above the highest of the plurality of layers of conductive strips.

8. The method of claim 1, wherein the conductive plate is disposed to the side of the plurality of layers of conductive strips.

9. A method of shielding a capacitor structure formed on a semiconductor substrate, the capacitor structure providing capacitance between a first node and a second node, the method comprising:
    forming one or more layers of conductive strips on the substrate;
    configuring each of the layers to have a plurality of conductive strips, with each of the conductive strips in each layer being connected to one of the first or second nodes, and
    forming a conductive shield adjacent to the capacitor structure for shielding the capacitor structure.

10. The method of claim 9, further comprising connecting the conductive shield to the first node.

11. The method of claim 9, further comprising configuring the conductive strips in each layer to be alternately connected to the first and second nodes.

12. The method of claim 11, wherein the one or more of layers of conductive strips are aligned so that strips connected to the first node lie above strips connected to the second node.

13. The method of claim 9, wherein the conductive shield is disposed beneath the lowest of the one or more layers of conductive strips.

14. The method of claim 13, the method further comprising forming a second conductive shield disposed above the highest of the one or more layers of conductive strips.

15. A method of providing a power amplifier for amplifying signals in an RF apparatus, the method comprising:
    forming a power amplifier circuit on a semiconductor substrate, the power amplifier circuit having first and second nodes;
    forming one or more layers of conductive strips on the substrate;
    configuring each of the layers to have a plurality of conductive strips, with each of the conductive strips in each layer being connected to one of the first or second nodes to provide a capacitance between the first and second nodes;
    forming a conductive shield adjacent to the capacitor structure for shielding the capacitor structure; and
    coupling the conductive shield to one of the nodes.

16. The method of claim 15, further comprising connecting the conductive shield to the first node.

17. The method of claim 15, further comprising configuring the conductive strips in each layer to be alternately connected to the first and second nodes.

18. The method of claim 17, wherein the one or more of layers of conductive strips are aligned so that strips connected to the first node lie above strips connected to the second node.

19. The method of claim 15, wherein the conductive shield is disposed beneath the lowest of the one or more layers of conductive strips.

20. The method of claim 19, the method further comprising forming a second conductive shield disposed above the highest of the one or more layers of conductive strips.

* * * * *